United States Patent
Tanaka et al.

(10) Patent No.: US 8,503,498 B2
(45) Date of Patent: Aug. 6, 2013

(54) MULTI-BEAM SEMICONDUCTOR LASER APPARATUS

(75) Inventors: Yoshinori Tanaka, Kyoto (JP); Eiji Miyai, Kyoto (JP); Dai Ohnishi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 13/429,147

(22) Filed: Mar. 23, 2012

(65) Prior Publication Data
US 2012/0243569 A1    Sep. 27, 2012

(30) Foreign Application Priority Data

Mar. 23, 2011 (JP) .................................. 2011-64458
Mar. 23, 2011 (JP) .................................. 2011-64460

(51) Int. Cl.
*H01S 5/00* (2006.01)
(52) U.S. Cl.
USPC .................. 372/44.01; 372/43.01; 372/46.01; 372/50.121
(58) Field of Classification Search
USPC ....................... 372/50.12, 43.01, 44.01, 46.01
See application file for complete search history.

(56) References Cited

U.S. PATENT DOCUMENTS

| 6,995,406 B2* | 2/2006 | Tojo et al. ...................... 257/103 |
| 7,675,954 B2* | 3/2010 | Kadowaki et al. .......... 372/43.01 |
| 2004/0105471 A1* | 6/2004 | Kneissl et al. .................. 372/36 |
| 2010/0111129 A1* | 5/2010 | Nakashima et al. ..... 372/46.012 |

FOREIGN PATENT DOCUMENTS

| JP | 2009-212538 A | 9/2009 |
| JP | 2010-135731 A | 6/2010 |

* cited by examiner

*Primary Examiner* — Dung Nguyen
(74) *Attorney, Agent, or Firm* — Rabin & Berdo, P.C.

(57) ABSTRACT

A multi-beam semiconductor laser apparatus includes three or more stripe semiconductor laser emission units which are arranged on a substrate, isolation grooves which separate the semiconductor laser emission units from each other, and pad electrodes which are disposed on outer sides of the outermost semiconductor laser emission units. The isolation grooves are formed between the pad electrodes and the semiconductor laser emission units adjacent to the pad electrodes and between adjacent semiconductor laser emission units. A distance between two isolation grooves formed on outer sides of the outermost semiconductor laser light emission units is smaller than a distance between two isolation grooves formed on both sides of inner ones of the semiconductor laser light emission units.

7 Claims, 23 Drawing Sheets

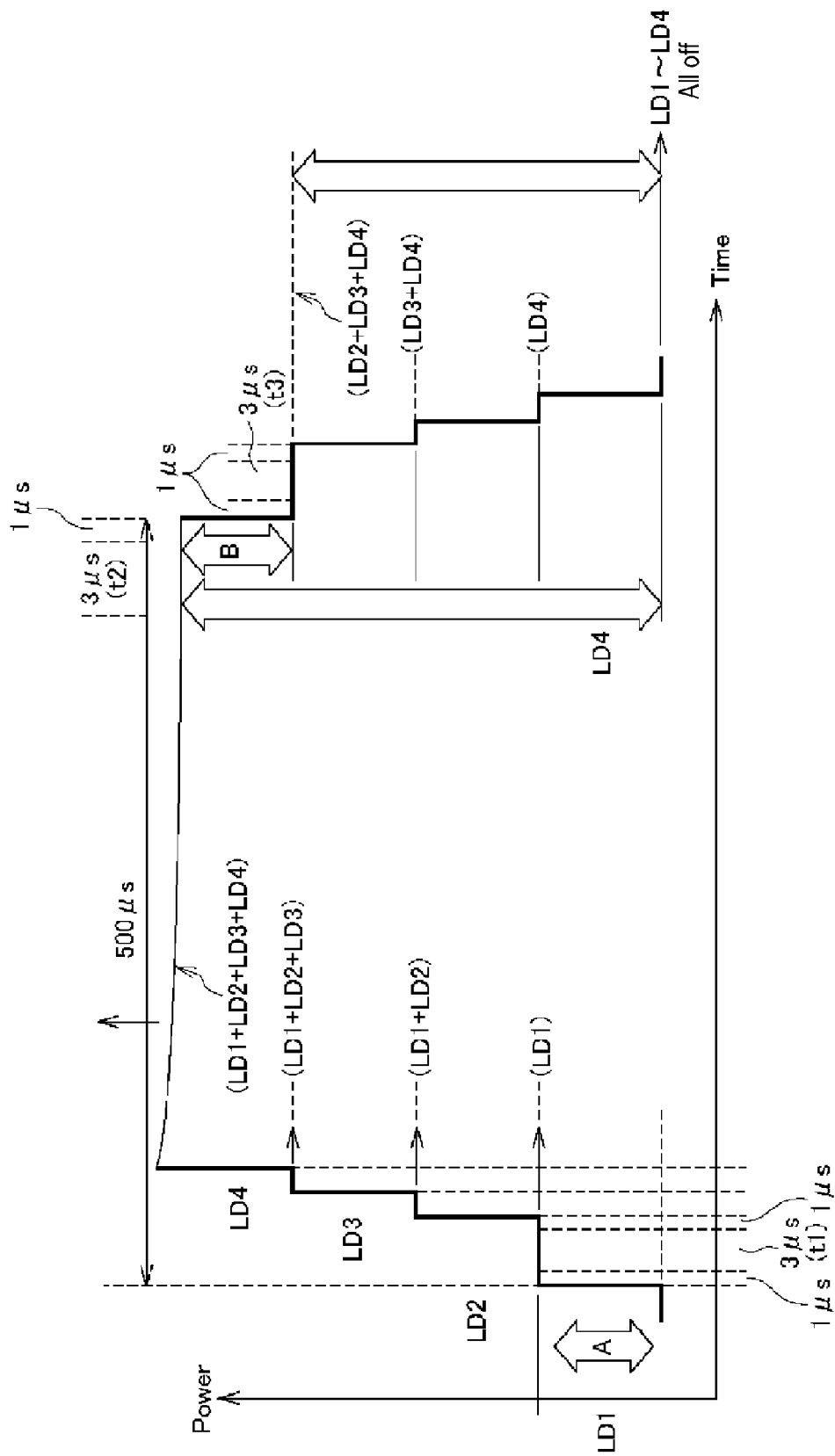

|  | LD1 | LD2 | LD3 | LD4 |
|---|---|---|---|---|
| Droop | 6.59 | 7.01 | 7.51 | 7.76 |
| Droop + Thermal crosstalk [%] | 12.18 | 14.09 | 16.35 | 15.17 |
| Thermal crosstalk [%] | 5.60 | 7.07 | 8.84 | 7.41 |

| Structure | Crosstalk [%] | | Crosstalk difference [%] |
| | Inner LD | Outer LD | Inner LD - Outer LD |
|---|---|---|---|
| A | 10.83 | 7.39 | 3.45 |
| B | 10.14 | 7.62 | 2.52 |
| C | 9.75 | 8.69 | 1.07 |

MULTI-BEAM SEMICONDUCTOR LASER APPARATUS

CROSS-REFERENCE TO RELATED APPLICATIONS

This application is based upon and claims the benefit of priority from Japanese Patent Application Nos. 2011-64458 and 2011-64460, filed on Mar. 23, 2011, respectively, the entire contents of which are incorporated herein by reference.

TECHNICAL FIELD

The present disclosure relates to a multi-beam semiconductor laser apparatus which includes a plurality of laser stripes, from each of which laser light is emitted.

BACKGROUND

A semiconductor laser has a wide range of applications, such as an optical disk apparatus, a laser beam printer, a copy machine, etc. High speed performance and high capability of information processing are typically required for the semiconductor laser applications. To meet the requirements for high speed performance and high capability of information processing, there has been proposed a so-called multi-beam semiconductor laser apparatus which emits a plurality of laser beams (hereinafter referred to as a "multi-beam") as a source of light.

Such a multi-beam semiconductor laser apparatus has a structure where stripe semiconductor laser devices are arranged in the form of a plurality of arrays to emit light. Thus, the plurality of semiconductor laser devices is used to generate and emit laser light.

In the multi-beam semiconductor laser apparatus, for the purpose of independently driving the laser devices, separation grooves for electrical isolation between the laser units are formed between adjacent laser units. The respective laser units have wiring layers to connect stripe electrodes formed on a ridge having its sides surrounded by the separation grooves, and pad electrodes formed away from the ridge. As density and integration of the apparatus becomes larger, a distance between adjacent laser devices becomes smaller resulting in an electrical crosstalk between the laser devices.

There is, for example, a technique for reducing electrical crosstalk by forming high resistive separation regions between the laser emission units and between the laser emission units and conductive layers acting as lead units.

However, conventional multi-beam semiconductor laser apparatuses have problems of thermal crosstalk in addition to the electrical crosstalk. A thermal crosstalk refers to heat generated by current applied to one semiconductor laser unit, which has an effect on different semiconductor laser units, such that power from laser beams of individual semiconductor laser units may be varied. For example, inner laser units, which are arranged in parallel are more likely to store heat than outer ones, which may result in an increase of temperature of the apparatus and, hence, deterioration of crosstalk characteristics.

In addition, the wiring distance of the inner laser devices from pad electrodes in the conventional multi-beam semiconductor laser apparatus is longer than that of the outer ones. Thus the resistance of the inner laser devices is larger than that of the outer ones by the amount corresponding to the difference in the wiring distance. This has an effect on laser driving current and the amount of heat generated and may result in poor emission characteristics of the inner laser devices, which are farther away from the pad electrodes than the outer ones.

SUMMARY

The present disclosure provides some embodiments of a multi-beam semiconductor laser apparatus which is configured to be capable of providing a uniform thermal crosstalk characteristic across laser devices, thereby reducing a difference in laser beam power between respective laser units.

The present disclosure also provides some embodiments of a multi-beam semiconductor laser apparatus which is configured to be capable of reducing a difference in emission characteristics between inner laser emission units and outer laser emission units, which depends on a distance between a wiring layer and a pad electrode.

According to one aspect of the present disclosure, there is provided a multi-beam semiconductor laser apparatus. The multi-beam semiconductor laser apparatus includes at least three stripe semiconductor laser emission units, isolation grooves, and pad electrodes. The at least three semiconductor laser emission units are arranged in parallel on a substrate. The isolation grooves are configured to separate the semiconductor laser emission units from each other. The pad electrodes are disposed on outer sides of outermost semiconductor laser emission units. In this configuration, the isolation grooves are formed between the pad electrodes and the semiconductor laser emission units adjacent to the pad electrodes and between adjacent semiconductor laser emission units. In addition, a distance between two isolation grooves formed on both sides of the outermost semiconductor laser emission units is smaller than a distance between two isolation grooves formed on both sides of inner semiconductor laser emission units.

According to another aspect of the present disclosure, there is provided a multi-beam semiconductor laser apparatus. The multi-beam semiconductor laser apparatus includes at least three stripe semiconductor laser emission units, isolation grooves, and pad electrodes. The at least three semiconductor laser emission units are arranged on a substrate. The isolation grooves are configured to separate the semiconductor laser emission units from each other. The pad electrodes are disposed on outer sides of outermost semiconductor laser emission units. In this configuration, the isolation grooves are formed between the pad electrodes and the semiconductor laser emission units adjacent to the pad electrodes and between adjacent semiconductor laser emission units. Further, a depth of outermost isolation grooves is larger than a depth of inner isolation grooves.

According to yet another aspect of the present disclosure, there is provided a multi-beam semiconductor laser apparatus. The multi-beam semiconductor laser apparatus includes at least three stripe semiconductor laser emission units, stripe ridges, ridge electrodes and a plurality of wiring layers. The at least three semiconductor laser emission units are arranged on a substrate. The stripe ridges are placed in the semiconductor laser emission units. The ridge electrodes are formed on the stripe ridges. The plurality of wiring layers is formed in a direction traversing the stripe ridges for electrical connection with the ridge electrodes. In this configuration, inner semiconductor laser emission units include gold plating layers formed on the ridge electrodes at positions which are electrically isolated from the wiring layers.

According to still another aspect of the present disclosure, there is provided a multi-beam semiconductor laser apparatus. The multi-beam semiconductor laser apparatus includes at least three stripe semiconductor laser emission units, stripe ridges, ridge electrodes, a plurality of wiring layers and pad electrodes. The at least three semiconductor laser emission units are arranged on a substrate. The stripe ridges are placed in the semiconductor laser emission units. The ridge electrodes are formed on the stripe ridges. The plurality of wiring layers is formed in a direction traversing the stripe ridges for electrical connection with the ridge electrodes. The pad electrodes are connected to the plurality of wiring layers and are disposed on outer sides of outermost semiconductor laser emission units. In this configuration inner semiconductor laser emission units have a larger contact area between the wiring layers and the ridge electrodes than the outermost semiconductor laser emission units.

BRIEF DESCRIPTION OF THE DRAWINGS

FIG. 9 illustrates a measuring method of thermal crosstalk.

FIGS. 10A1 to 10A3 are schematic sectional views of a multi-beam semiconductor laser apparatus including four laser emission units.

DETAILED DESCRIPTION

Figure 1:
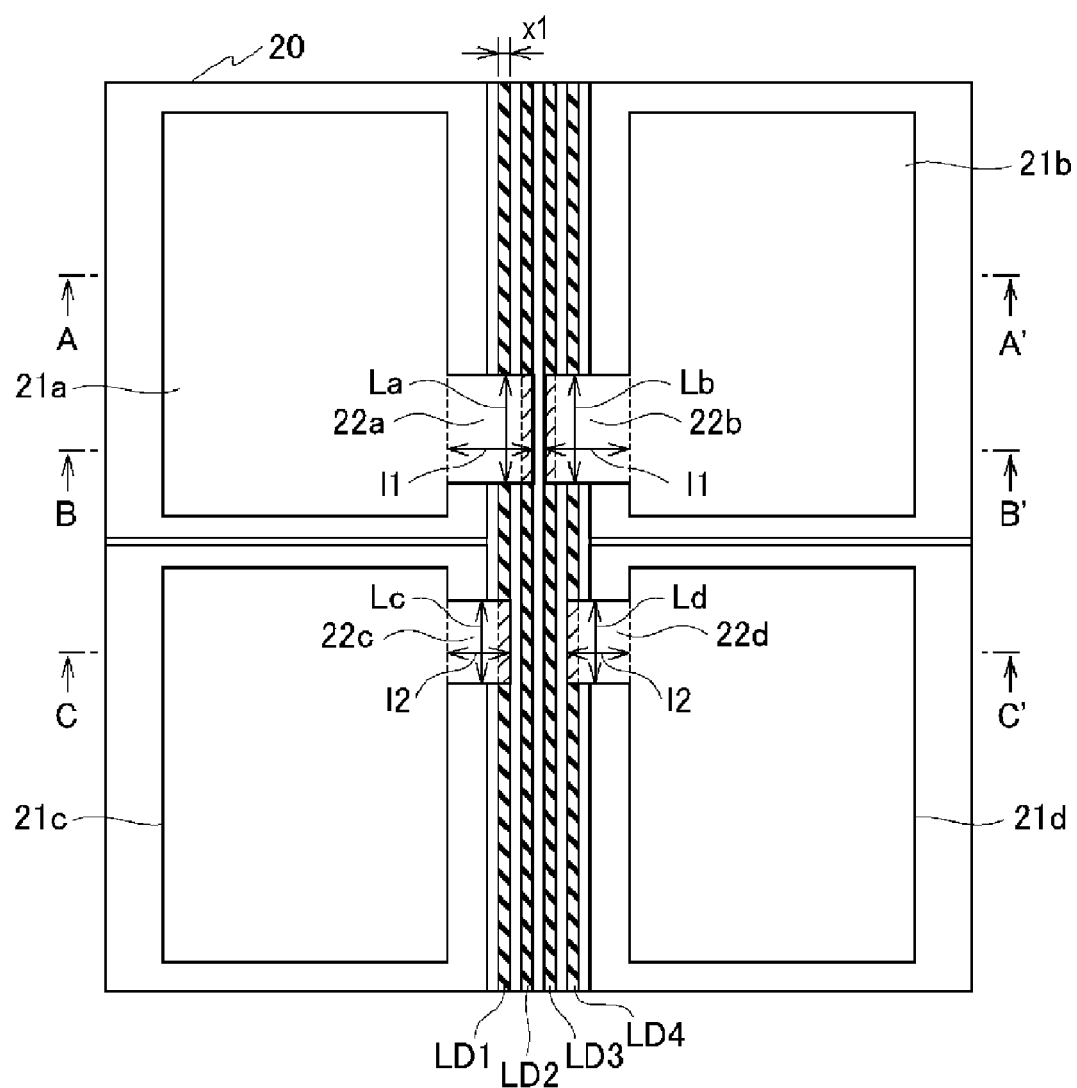
FIG. 1 is a plan view of a multi-beam semiconductor laser apparatus when viewed from above, according some embodiments.

Reference will be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as to not unnecessarily obscure aspects of the various embodiments.

Various embodiments of the present disclosure will now be described with reference to the drawings. Throughout the drawings, same or similar devices are denoted by same or similar reference numerals. Figures regarding structures are schematic and may include different dimensional relationships and scales.

Figure 2:
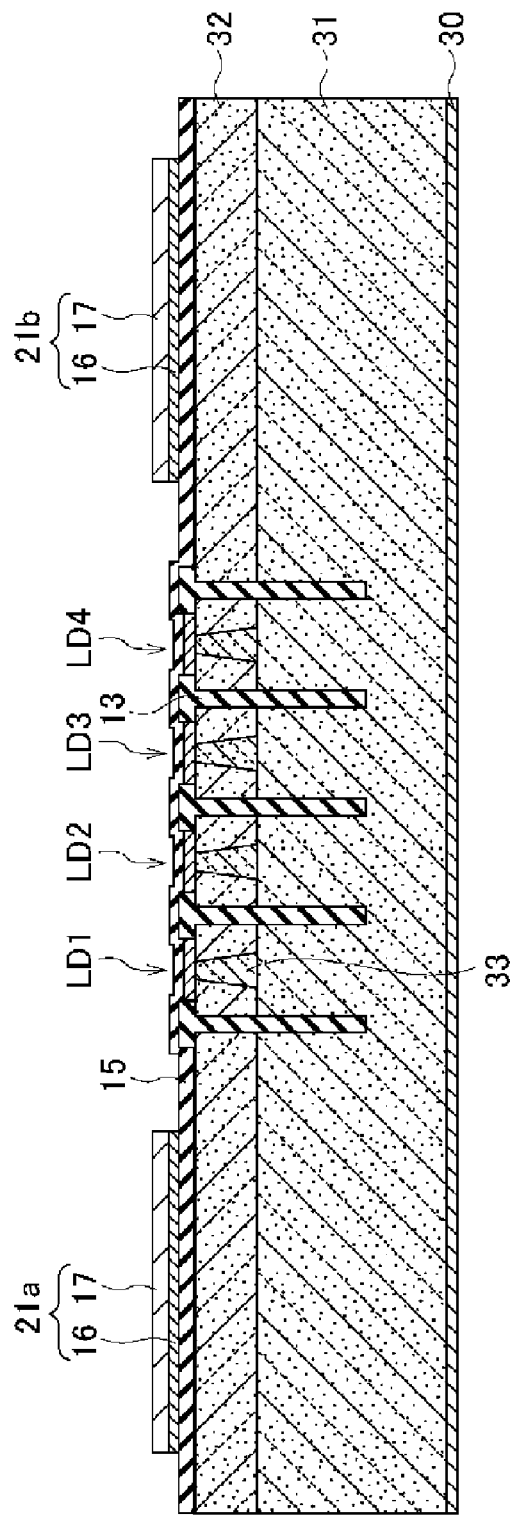
FIG. 2 is a sectional view taken along line A-A' in FIG. 1.
Figure 3:
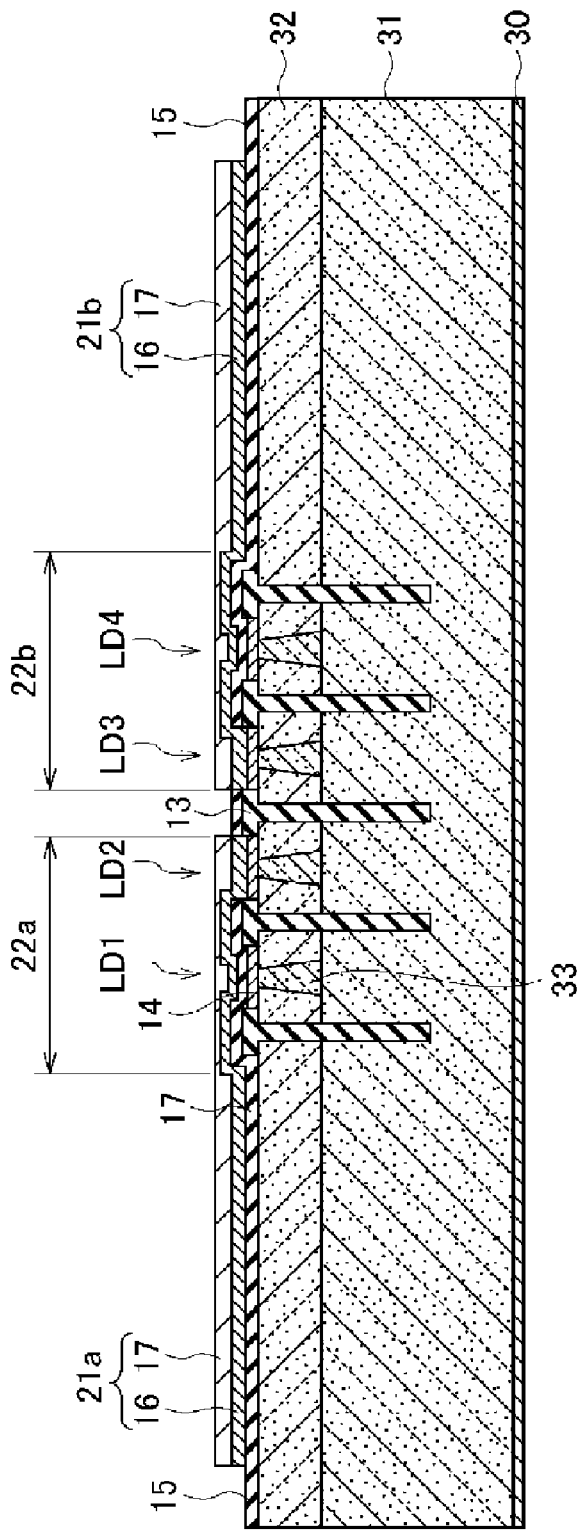
FIG. 3 is a sectional view taken along line B-B' in FIG. 1.
Figure 4:
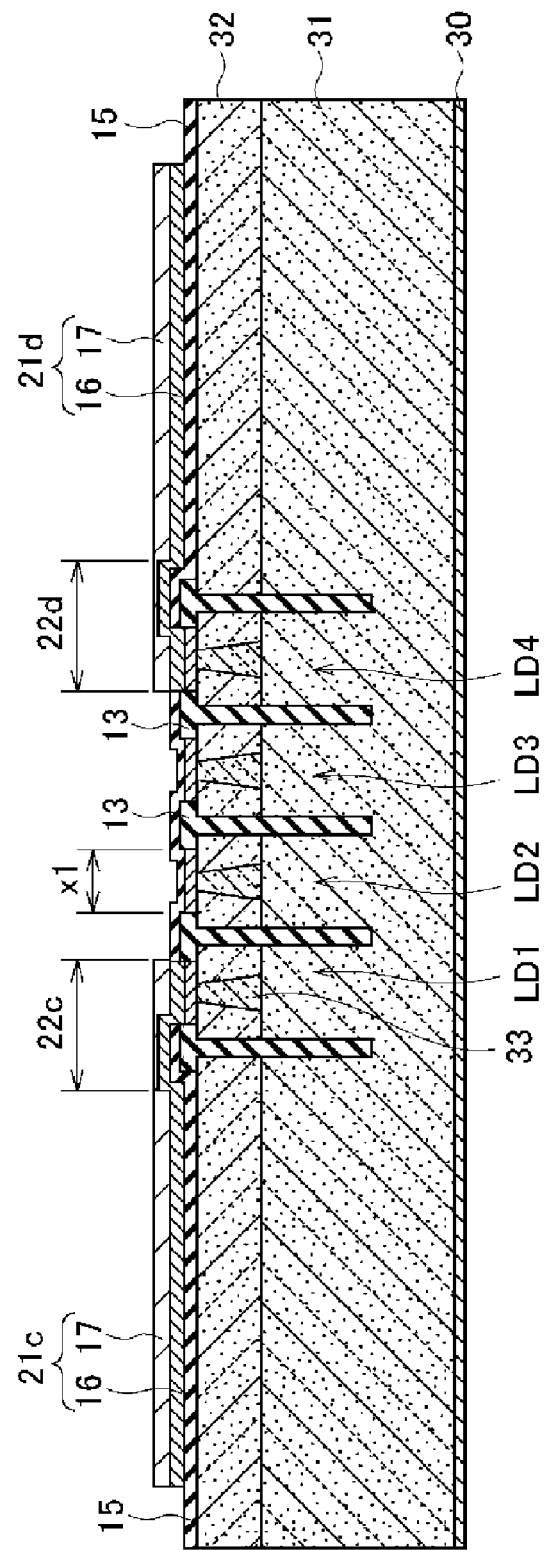
FIG. 4 is a sectional view taken along line C-C' in FIG. 1.

FIG. 1 is a plan view of a multi-beam semiconductor laser apparatus when viewed from above. FIG. 2 is a sectional view taken along line A-A' in FIG. 1, FIG. 3 is a sectional view taken along line B-B' in FIG. 1, and FIG. 4 is a sectional view taken along line C-C' in FIG. 1. A multi-beam semiconductor laser apparatus includes a laser emission unit LD1, a laser emission unit LD2, a laser emission unit LD3 and a laser emission unit LD4. An insulating film 15 is not shown in FIG. 1 for the purpose of brevity and clarity of the figure.

The laser emission units LD1, LD2, LD3 and LD4 have respective stripe ridges indicated by bold oblique lines in FIG. 1. As shown, a width of each of the ridges is denoted by x1. In addition, a wiring layer 22a is defined by a length La and a width l1 in the ridge stripe direction. The width of the wiring layer 22a refers to a length in a direction traversing the ridge stripe. That is, this corresponds to a length perpendicular to the ridge stripe direction in the example of FIG. 1. A wiring layer 22b is formed by a length Lb and the width l1 in the ridge stripe direction. A wiring layer 22c is formed by a length Lc and a width l2 in the ridge stripe direction and a wiring layer 22d is defined by a length Ld and the width l2 in the ridge stripe direction.

Pad electrodes 21a, 21b, 21c and 21d are formed on a stacked structure 20 of the multi-beam semiconductor laser apparatus, and are used as wire bonding electrodes for supplying current to the laser emission units LD1 to LD4. These pad electrodes are disposed on both sides of the laser emission units LD1 to LD4, which are arranged in parallel in the ridge stripe direction.

The pad electrode 21a and the pad electrode 21b are shown in FIG. 2, although wiring layers extending from all of the pad electrodes are not shown. As shown in FIG. 3, a p-electrode 14 formed on the ridge of the laser emission unit LD2 is connected to the pad electrode 21a via the wiring layer 22a. A p-electrode 14 formed on the ridge of the laser emission unit LD3 is connected to the pad electrode 21b via the wiring layer 22b. In addition, the stacked structure 20 includes a flat semiconductor stack 31 and a semiconductor stack 32. The semiconductor stack 32 includes a ridge and an embedded layer. The pad electrode 21b and the wiring layer 22b are formed as a multi-layered structure, which includes a metal layer 16 and a plating layer 17 stacked thereon. Similarly, the pad electrode 21a and the wiring layer 22a are also formed as a multi-layered structure, which includes the metal layer 16 and the plating layer 17 stacked thereon.

In addition, as shown in FIG. 4, a p-electrode 14 formed on the ridge of the laser emission unit LD1 is connected to the pad electrode 21c via the wiring layer 22c. A p-electrode 14 formed on the ridge of the laser emission unit LD4 is connected to the pad electrode 21d via the wiring layer 22d. The pad electrode 21c and the wiring layer 22c are formed as a multi-layered structure, which includes the metal layer 16 and the plating layer 17 stacked thereon. Similarly, the pad electrode 21d and the wiring layer 22d are also formed as a multi-layered structure, which includes the metal layer 16 and the plating layer 17 stacked thereon. A width of an opening area (or main area) of the insulating film 15 covering the p-electrode 14 in LD1 to LD4 is formed to be equal to the width x1 of the ridges of LD1 to LD4 shown in FIG. 1.

As described earlier, the width l1 of the wiring layers 22a and 22b for the inner ones LD2 and LD3 of the four laser emission units is formed to be larger than the width 12 of the wiring layers 22c and 22d for the outer ones LD1 and LD4. Accordingly, since such a difference in wiring layer width provide higher resistance of the inner laser emission units LD2 and LD3 when viewed from the pad electrodes, if the same voltage is applied to LD1 to LD4, there occurs a variation in laser driving current, which results in a deterioration of emission characteristics. In addition, if the same laser driving current flows through LD1 to LD4, the amount of heat generated in the inner laser emission units increases, this also results in a deterioration of emission characteristics.

The described multi-beam semiconductor laser apparatus is configured such that a contact area of the p-electrode and the wiring layers in LD2 and LD3 is larger than a contact area of the p-electrode and the wiring layers in LD1 and LD4. That is, by setting the opening area (or main area) of the insulating film 15 (covering the p-electrode in the inner laser emission units LD2 and LD3) to be larger than the opening area of the outer laser emission units LD1 and LD4, the contact area between the p-electrode 14 and the wiring layers 22a and 22b in LD2 and LD3 is formed to be larger than the contact area in LD1 and LD4.

Oblique line portions in each region of the wiring layers 22a, 22b, 22c and 22d shown in FIG. 1 indicate contact areas between the wiring layers 22a, 22b, 22c and 22d and the p-electrode in the laser emission units. The wiring layer 22a, 22b, 22c and 22d contact the p-electrodes of LD1, LD2, LD3 and LD4, respectively.

In this manner, contact resistance can be reduced by increasing the contact area of the wiring layers and the p-electrodes on the ridges. This allows the total resistance of the inner laser emission units to be substantially equal to the total resistance of the outer laser emission units, thereby equalizing emission characteristics of the inner and outer laser emission units.

In more detail, since the widths x1 of the opening areas (main areas) of the insulating film 15 covering the p-electrodes 14 in LD1 to LD4 are equal to each other, the lengths La, Lb, Lc and Ld in the stripe direction of the opening areas may be modified to change the opening areas. Since the stripe directions of the wiring layers are typically set for the wiring layers to contact the p-electrodes 14, it is configured such that the lengths La, Lb, Lc and Ld in the stripe direction of the opening areas are equal to the lengths of the wiring layers 22a, 22b, 22c and 22d.

As a result, as shown in FIG. 1, the length in the stripe direction of the wiring layer 22a is equal to the length La in the stripe direction of the opening area in which the p-electrode 14 contacts the wiring layer 22a. The length in the stripe direction of the wiring layer 22b is equal to the length Lb in the stripe direction of the opening area in which the p-electrode 14 contacts the wiring layer 22b. The length in the stripe direction of the wiring layer 22c is equal to the length Lc in the stripe direction of the opening area in which the p-electrode 14 contacts the wiring layer 22c. The length in the stripe direction of the wiring layer 22d is equal to the length Ld in the stripe direction of the opening area in which the p-electrode 14 contacts the wiring layer 22d.

In addition, the lengths La and Lb of the inner laser emission units LD2 and LD3 are set to be larger than the lengths Lc and Ld of the outer laser emission units LD1 and LD4. This allows the opening areas of the inner laser emission units LD2 and LD3 to be increased, thereby reducing contact resistance. In FIG. 1, since the width l1 of the wiring layer 22a from the pad electrode 21a is equal to the width l1 of the wiring layer 22b from the pad electrode 21b, there is no difference in resistances based on the width of the wiring layers. Thus, the opening areas may be set to be equal to each other by setting the length La to be equal to the length Lb. Similarly, since the width l2 of the wiring layer 22c from the pad electrode 21c is equal to the width l2 of the wiring layer 22d from the pad electrode 21d, the opening areas may be set to be equal to each other by setting the length Lc to be equal to the length Ld.

Although it is illustrated in the embodiment of FIG. 1 that the four laser emission units LD1 to LD4 are arranged in parallel, the present disclosure is not limited thereto, but the principle of the present disclosure may be extensively applied to a laser apparatus including N laser emission units (where N is an integer greater than 0). In this case, although N wiring layers may be formed, contact areas between the wiring layers and the electrodes on ridges of the laser emission units may be increased when formed as it becomes closer to the center of the semiconductor laser emission units, which are arranged in parallel.

Figure 5:
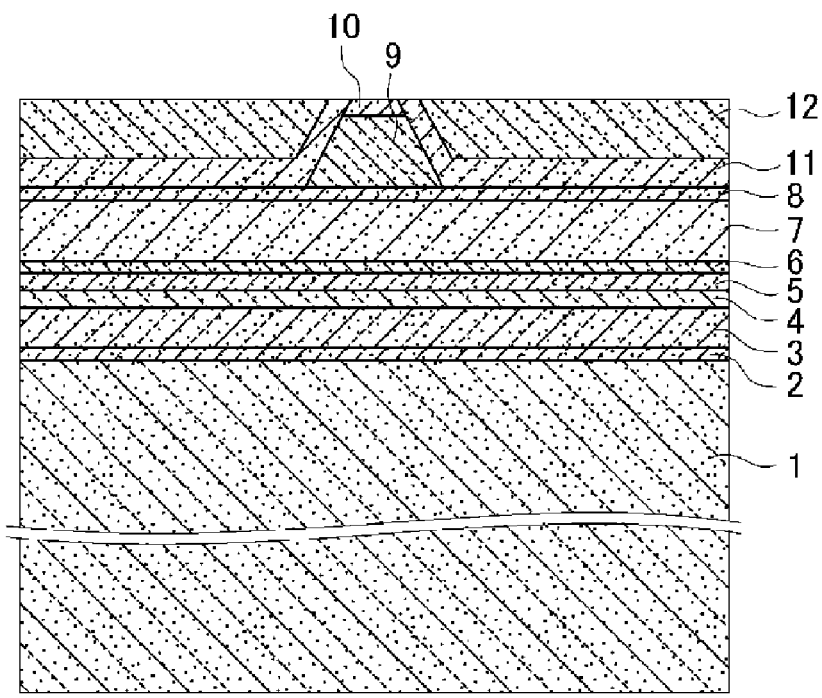
FIG. 5 illustrates an example of a semiconductor stacked structure of one laser emission unit in the multi-beam semiconductor laser apparatus.

The laser emission units LD1 to LD4 as configured above have the same layered structure in the stacked structure. For example, a structure of each laser emission unit may be as shown in FIG. 5. As shown, on an n-type GaAs substrate are stacked an n-type GaAs buffer layer 2, an n-type AlGaAs clad layer 3, an n-type AlGaAs guide layer 4, an n-type AlGaAs active layer 5, a p-type AlGaAs guide layer 6, a first p-type AlGaAs clad layer 7 and a p-type InGaP etching stop layer 8. A second p-type AlGaAs clad layer 9 and a p-type GaAs cap layer 10 having a stripe structure are formed on the p-type InGaP etching stop layer 8 in order and constitute a ridge. In addition, an n-type AlGaAs embedded layer 11 is formed on the side of the second p-type AlGaAs clad layer 9 and the p-type GaAs cap layer 10 and an n-type GaAs embedded layer 12 is stacked on the n-type AlGaAs embedded layer 11 such that the top of each laser emission unit becomes flat.

Next, a manufacturing method of the multi-beam semiconductor laser apparatus shown in FIGS. 1 to 4 will be described with reference to FIGS. 8A to 8K. In the following description, since the four semiconductor laser emission units in the multi-beam semiconductor laser apparatus are manufactured according to the same method, only a manufacturing method for one semiconductor laser emission unit is shown in FIGS. 8A to 8K. It will be appreciated that any number of semiconductor laser emission units may be possible, and is not limited to four units as illustratively shown in FIGS. 1 to 4.

Figure 8A:
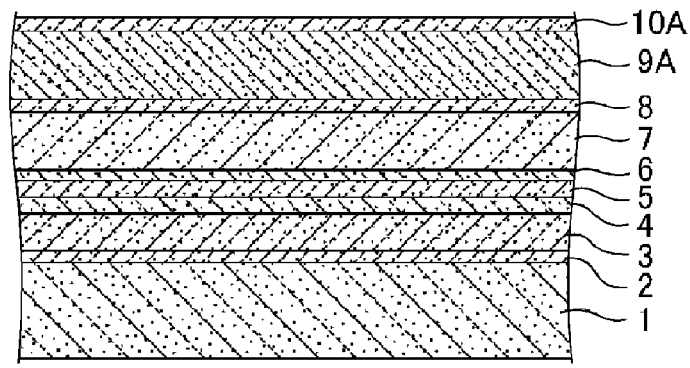
FIGS. 8A to 8K illustrate one manufacturing process of the multi-beam semiconductor laser apparatus.

First, as shown in FIG. 8A, on an n-type GaAs substrate 1 are stacked an n-type GaAs buffer layer 2, an n-type AlGaAs clad layer 3, an n-type AlGaAs guide layer 4, an n-type AlGaAs active layer 5, a p-type AlGaAs guide layer 6, a first p-type AlGaAs clad layer 7, a p-type InGaP etching stop layer 8, a second p-type AlGaAs clad layer 9A and a p-type GaAs cap layer 10A.

Figure 8B:
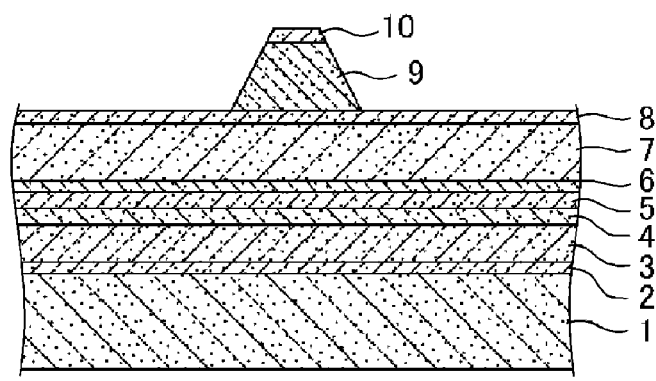

Next, wet etching is performed to manufacture a stripe ridge (FIG. 8B). At this time, because of the presence of the p-type InGaP etching stop layer 8, the ridge etching is stopped by the p-type InGaP etching stop layer 8, and the second p-type AlGaAs clad layer 9 and the p-type GaAs cap layer 10 are formed to constitute the ridge.

Figure 8C:
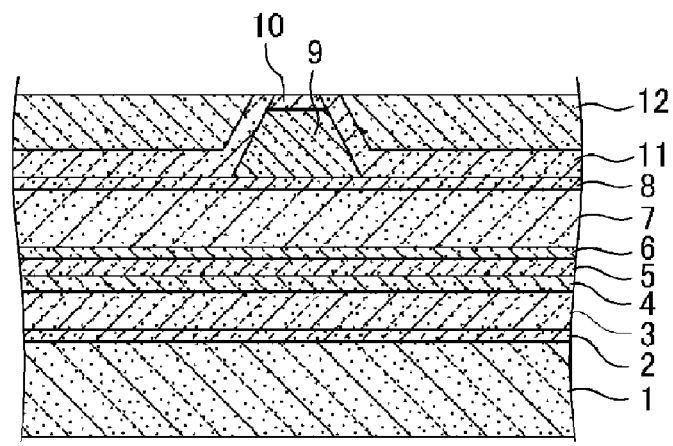

As shown in FIG. 8C, an n-type AlGaAs embedded layer 11 and an n-type GaAs embedded layer 12 are stacked and planarized on the side of the second p-type AlGaAs clad layer 9 and the p-type GaAs cap layer 10 in order.

Figure 8D:
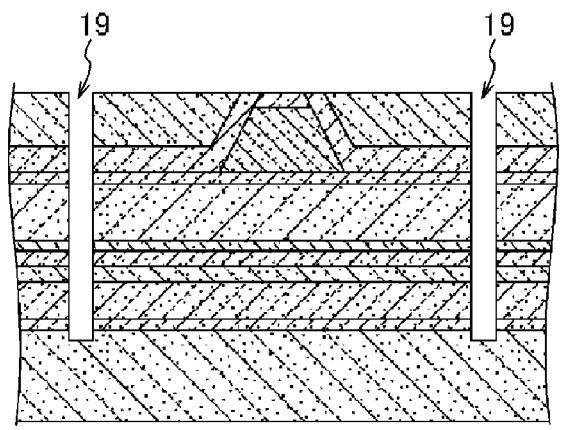

As shown in FIG. 8D, isolation grooves 19 for isolating the laser emission units of LD1 to LD4 from each other are formed using dry etching.

Figure 8E:
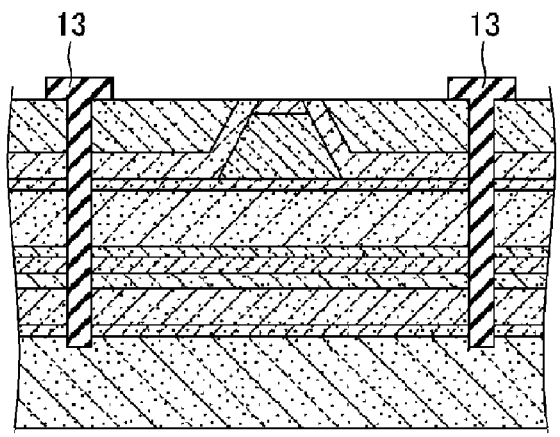
Figure 8F:
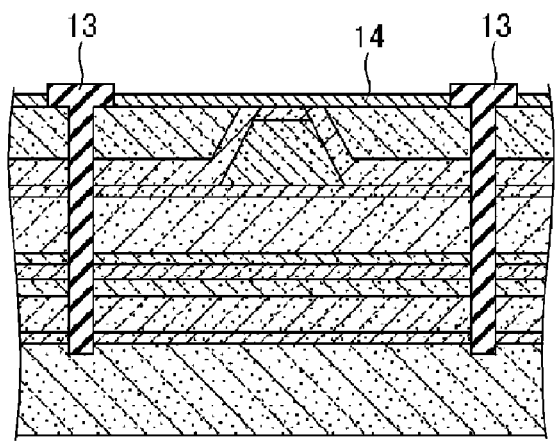

Next, inter-element insulating films 13 are formed in the respective isolation grooves 19 (FIG. 8E). The inter-element insulating films 13 are prepared by thermally curing, for example, photosensitive polyimide resin. A p-electrode 14 is prepared using deposition as shown in FIG. 8F. The p-electrode 14 is formed to have a Ti/Au stacked structure in which a gold layer is stacked on a titanium layer, for example.

Figure 8G:
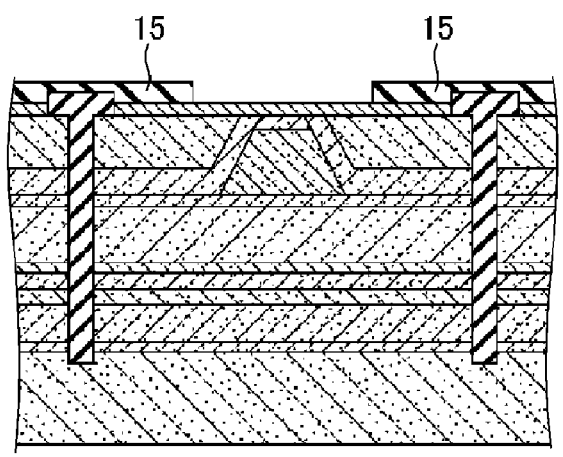

Next, an insulating film is formed on the inter-element insulating films 13 and the p-electrode 14, and is subjected to etching in order to form a region where the wiring layers 22a to 22d will contact the p-electrode 14, thereby preparing an insulating film 15 having a main opening shown in FIG. 8G. The insulating film 15 is made of $SiO_2$ etc., and a portion of the insulating film 15 corresponding to the contact region is removed by wet etching.

Figure 8H:
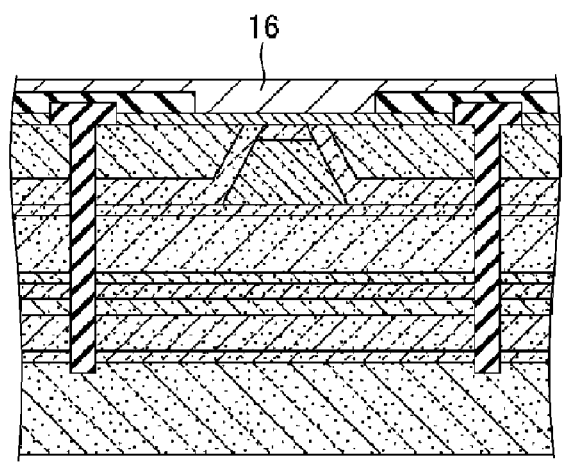
Figure 8I:
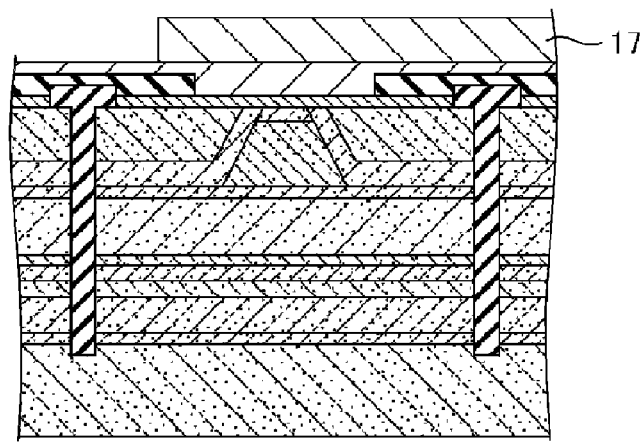

As shown in FIG. 8H, a metal layer 16 forming the wiring layers 22a to 22d and the pad electrode is deposited on the entire surface. The metal layer is made of Ti, etc. A plating layer 17 is formed from a region of the wiring layers to a region of the pad electrodes (FIG. 8I). The plating layer 17 is made of Au, etc.

Figure 8J:
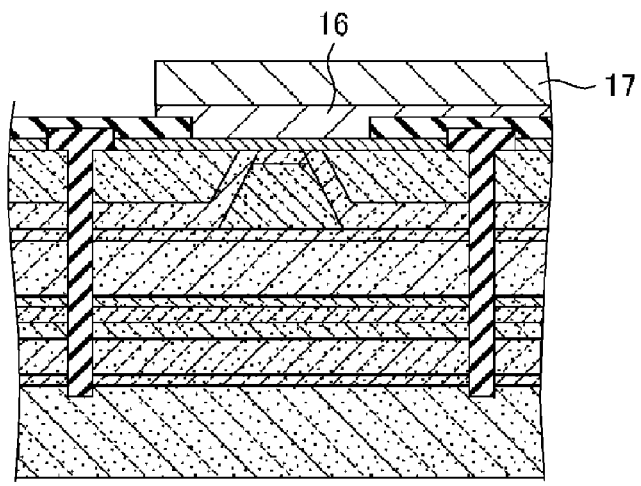
Figure 8K:
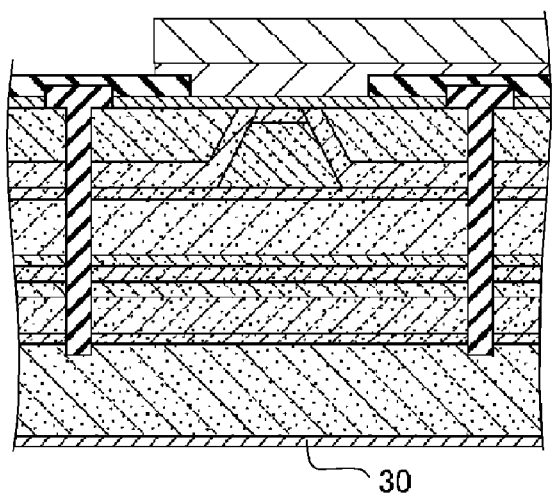

As shown in FIG. 8J, metal etching is performed to remove the metal layer 16, while leaving portions of the metal layer 16 corresponding to the regions of the wiring layers and the pad electrodes. The rear side of the n-type GaAs substrate 1 is polished and an n-electrode 30 is formed by deposition (FIG. 8K). The n-electrode 30 is formed as, for example, a multi-layered metal (AuGe/Ni/Ti/Au) film in which metals such as Ni, Ti, Au etc., are stacked on an alloy of AuGe in order.

Figure 6:
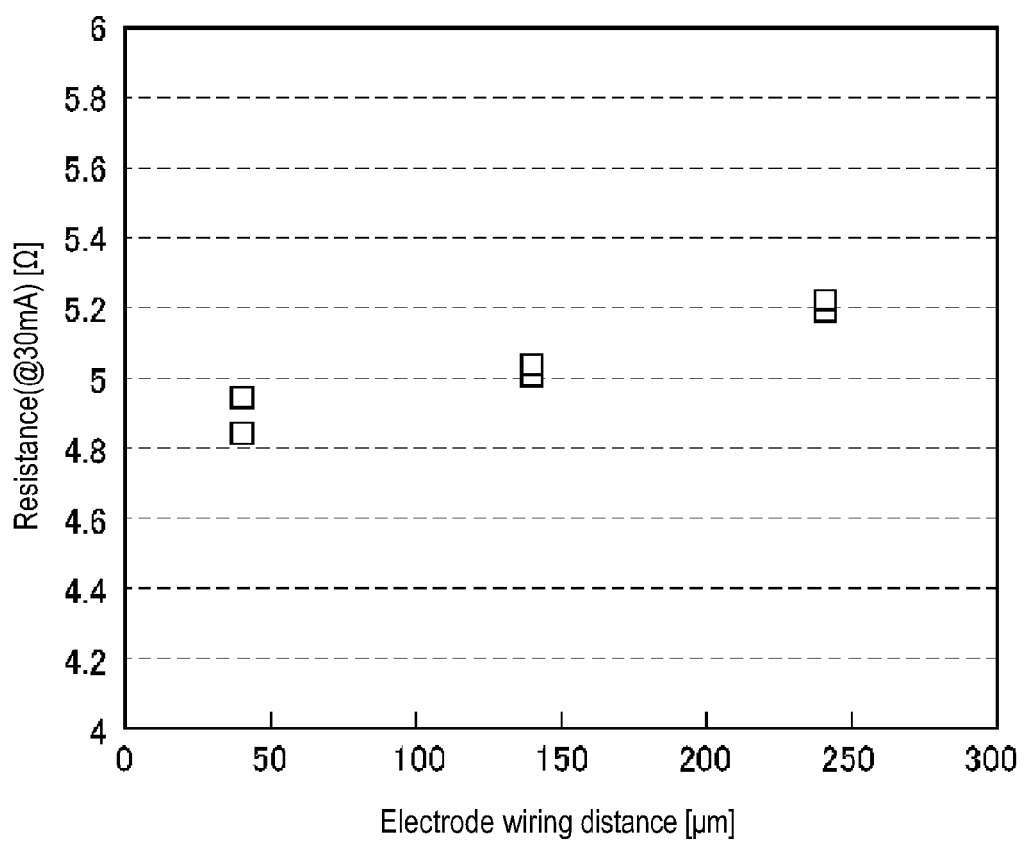
FIG. 6 illustrates a relationship between resistance of a laser emission unit and an electrode wiring distance when a laser driving current of 30 mA flows.

FIG. 6 shows a change in resistance depending on a distance of a wiring layer from a pad electrode (an electrode wiring distance). The change in resistance was measured by a laser emission unit having the structure shown in FIG. 1 and the layer structure shown in FIG. 5. The measurement was made with a flow of predetermined current of 30 mA through the laser emission unit. In FIG. 6, a vertical axis represents resistance (Ω) and a horizontal axis represents an electrode wiring distance (μm). The resistance increases with increase in the electrode wiring distance. For example, the resistance increases from about 4.95Ω to about 5.2Ω within a range of 50 μm to 250 μm of the electrode wiring distance.

Figure 7:
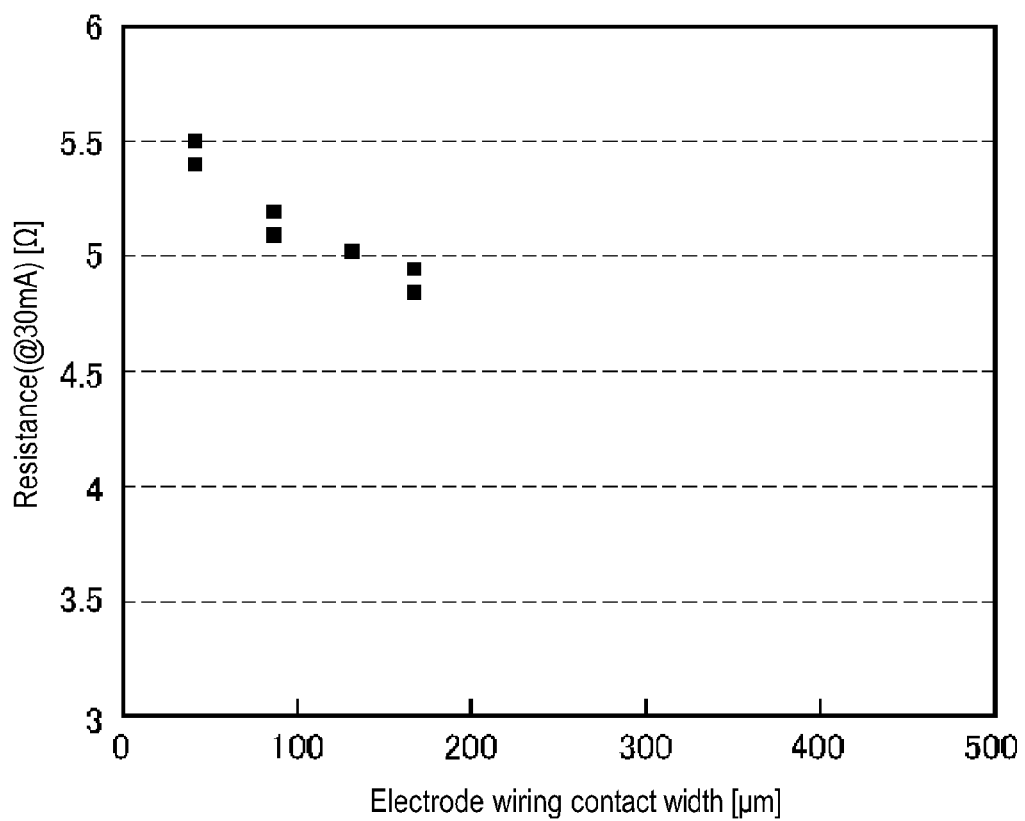
FIG. 7 illustrates a relationship between resistance of a laser emission unit and an electrode wiring contact width when a laser driving current of 30 mA flows.

FIG. 7 shows a relationship between a contact area between the p-electrode and the wiring layer disposed on a ridge and resistance of the laser emission unit. The change of the contact area of the p-electrode and the wiring layer disposed on the ridge depends on the change of a wiring layer width l1a and l2 corresponding to a length in the traversing stripe direction in the wiring layer, as described above. In FIG. 7, a vertical axis represents resistance (Ω) obtained when a constant current of 30 mA flows through the laser emission unit and a horizontal axis represents an electrode wiring contact width (μm) corresponding to the contact area between the p-electrode and the wiring layer (an electrode wiring contact area).

In some embodiments, a variation in resistance depending on the wiring distance is 0.00004Ω/μm2 in FIG. 6 and a variation in resistance depending on the electrode wiring contact area is 0.0005Ω/μm2 in FIG. 7. In the structure where the four laser emission units are arranged in parallel, the wiring distance of the outer and inner laser emission units is 28 μm. Accordingly, by setting a ratio of electrode wiring contact areas such that the outer laser emission units:the inner laser emission units=1:1.16 to 1.40, a difference in resistance between the outer laser emission units and the inner laser emission units can be reduced.

As one example, assuming that an electrode wiring contact surface width is 220 μm and an electrode wiring contact area is 6160 μm$^2$, the amount of increase in wiring resistance of the inner laser emission units is 0.2464 (=6160×0.00004). This amount of increase may be 0.2218 to 0.2710 to set the margin of error within 10%. Using this median (0.2464), the electrode wiring contact area is 492.8 μm$^2$ (=0.2464/0.0005). Here, this electrode wiring contact area becomes 443.6 to 542 to set the margin of error within 10%. Then, a ratio of electrode wiring contact areas is set such that the outer laser emission units:the inner laser emission units=1760 (=220× 8):1760+492.8 (=median of 443.6 to 542)=1:1.28 (1.25 to 1.31).

In the meantime, to set a characteristic individual difference to 0.1Ω, the following calculation may be given. Assuming that an electrode wiring contact surface width is 220 μm and an electrode wiring contact area is 6160 μm$^2$, the amount of increase in wiring resistance of the inner laser emission units is 0.2464 (=6160×0.00004). This amount of increase is required to be 0.1464 to 0.3464 in order to set the characteristic individual difference to less than 0.1Ω Using this median (0.2464), the electrode wiring contact area required is 492.8 μm$^2$ (=0.2464/0.0005). Here, this electrode wiring contact area is 292.8 to 692.8 in order to set the characteristic individual difference to less than 0.1Ω. Then, a ratio of electrode wiring contact areas is set such that the outer laser emission units:the inner laser emission units=1760 (=220×8):1760+492.8 (=median of 292.8 to 692.8)=1:1.28 (1.16 to 1.40).

In addition, the main opening to contact the wiring layers 22a to 22d with the p-electrode 14 may have an elliptical shape other than a rectangular shape. This is because angles such as in the rectangle may cause an electric field to be undesirably locally concentrated on such angular portions.

Next, a thermal crosstalk characteristic and a droop characteristic will be described. When the plurality of laser emission units is arranged as shown in FIG. 1, heat generated by current applied to one laser emission unit has an effect on other laser emission units, so that power from the laser beams of individual laser emission units may be varied, which may be referred to as "thermal crosstalk." In addition, laser beam power during a short period of driving time is different from that laser beam power during a long period of driving time. Such a difference may be referred to as "droop."

FIGS. 10A1 to 10A3 are schematic sectional views of the multi-beam semiconductor laser apparatus having the four laser emission units shown in FIGS. 1 to 4. A region including a ridge inserted between two adjacent inter-element insulating films 13a to 13e shown in FIGS. 10A1 to 10A3 corresponds to one laser emission unit, and four laser emission units LD1, LD2, LD3 and LD4 are formed from the left side to the right side, as one example. FIG. 10A1 shows a case where distances between the inter-element insulating films 13a and 13b, between the inter-element insulating films 13b and 13c, between the inter-element insulating films 13c and 13d, and between the inter-element insulating films 13d and 13e are all set to be equal to W.

FIG. 10A2 shows a configuration, in one example, where the inter-element insulating films 13b and 13d are arranged to be deviated by 1.5 μm toward the outer side in order to set the distance between the inter-element insulating films 13a and 13b on both sides of the outer laser emission unit LD1 and the distance between the inter-element insulating films 13d and 13e on both sides of the outer laser emission unit LD4 to be shorter. FIG. 10A 3 shows a configuration, as one example, where the inter-element insulating films 13a and 13e are arranged to be deviated by 1.5 μm toward the inner side in order to set the distances between inter-element insulating films 13a and 13e on both sides of each of the outer laser emission units LD1 and LD4 to be shorter than those in FIG. 10A 2.

Figures 10B, 10C:
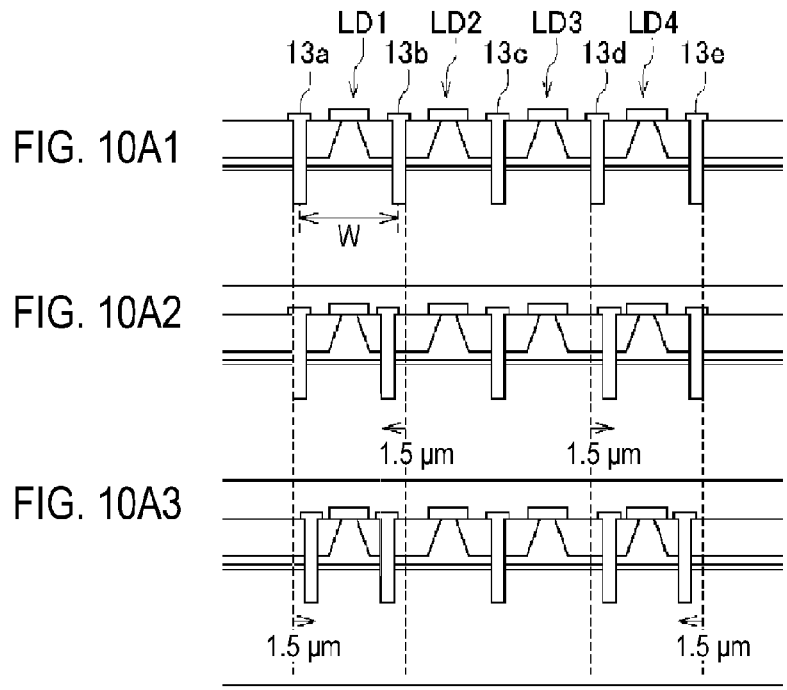
FIG. 10B illustrates temperature characteristics values in relation to each laser emission units in FIGS. 10A1 to 10A3.
FIG. 10C illustrates thermal crosstalks of inner and outer laser emission units in FIGS. 10A1 to 10A3.

A droop characteristic of each of the laser emission units LD1, LD2, LD3 and LD4 may be measured by driving these laser emission units individually and obtaining a difference between laser beam powers during a short period of driving time and a long period of driving time. The thermal crosstalk can be measured through the below methods described. As shown in FIG. 10B, by driving the laser emission units LD1, LD2, LD3 and LD4 in turn and then stopping the driving of the laser emission units in turn, data including a combination of thermal crosstalk and droop are measured, and the thermal crosstalk determination may be obtained when the droop is subtracted from the data.

First, as shown in FIG. 9, only LD1 is driven to emit a laser beam, in some embodiments. Although it is illustrated in FIG. 9 that LD1 is driven for a period of time of 5 μs, a temporal average P1 of laser beam power is calculated for a period of time of 3 μs (t1) which corresponds to the median of the period of time of 5 μs.

After lapse of time of 5 μs from the start of driving of LD1, LD2 is driven to emit a laser beam. A period of time LD1+LD2 indicates that the laser emission units LD1 and LD2 are being driven. After lapse of a period of time from the start of driving of LD2, LD3 is driven. A period of time LD1+LD2+LD3 indicates that the laser emission units LD1, LD2 and LD3 are being driven. After lapse of a period of time from the start of driving of LD3, LD4 is driven.

A period of time LD1+LD2+LD3 and LD4 indicates that the laser emission units LD1, LD2, LD3 and LD4 are being driven. After lapse of time of 500 μs from the first start of driving of LD1 after the start of driving of LD4, only the driving of LD1 is stopped. A temporal average P2 of total laser beam power of LD1 to LD4 is calculated for an immediately previous period of time of 3 μs (t2) of the period of time of 4 μs before this driving stop.

After the driving of LD1 is stopped, LD2, LD3 and LD4 continue to be driven for 5 μs and then only the driving of LD2 is stopped. A temporal average P3 of total laser beam power of LD2 to LD4 is calculated for a middle period of time of 3 μs (t3) of the driving period of time of 5 μs.

After the driving of LD2 is stopped, LD3 and LD4 continue to be driven and then the driving of LD3 is stopped. After the driving of LD3 is stopped, LD4 continues to be driven for a predetermined period of time and then the driving of LD4 is stopped, thereby completing to stop the driving of all of the laser emission units LD1 to LD4.

Based on the laser beam power temporal averages P1, P2 and P3 calculated in this manner, a value SD for the laser emission unit LD1 can be calculated, which is an addition of the thermal crosstalk and the droop. In other words, a thermal crosstalk characteristic component and a droop characteristic component are included in SD. Here, SD (%) (=1−(P2−P3)/P1×100). In this manner, SDs can be calculated for all of the laser emission units LD1 to LD4.

FIG. 10B is a table showing numerical values indicating data on SDs of respective LD1 to LD4, droop characteristics, and thermal crosstalk characteristics, according to some embodiments. The thermal crosstalk characteristics can be calculated by subtracting the droop characteristics from SDs for the laser emission units LD1 to LD4. The deduction of droop from droop plus thermal crosstalk corresponds to thermal crosstalk.

The above-mentioned thermal analysis used the following structures. A heat source of 60 mW (=input power−light power=2V×40 mA−10 mA×2) was employed for each laser emission unit. This heat source corresponds to a region of 5 μm×500 μm×112 nm below a ridge. The dimension of the multi-beam semiconductor laser apparatus was set such that a resonator length of each laser emission unit was 500 μm and a chip width was 450 μm. Heat transfer coefficient of a substrate rear side was set to 60000 W/m²K.

A distance between adjacent ridges constructing each laser emission unit was set to 28 μm. An inter-element insulating film was made of polyimide. A thermal conductivity of a GaAs substrate was set to 55 W/mK, an active layer corresponding to the heat source was made of $Al_{0.35}GaAs$ and its thermal conductivity was set to 11.18 W/mK, a clad layer was made of $Al_{0.53}GaAs$ and its thermal conductivity was set to 12.318 W/mK, a embedded layer was made of GaAs and its thermal conductivity was set to 55 W/mK, a thermal conductivity of polyimide of which the inter-element isolation film was set to 0.2049 W/mK, an electrode was made of gold and its thermal conductivity was set to 315 W/mK.

As can be seen from FIG. 10B, the inner laser emission unit LD2 has a thermal crosstalk characteristic that has deteriorated more than that of the outer laser emission unit LD1. Similarly the inner laser emission unit LD3 has a thermal crosstalk characteristic that has deteriorated more than that of the outer laser emission unit LD4. FIG. 10C is a table showing thermal crosstalk of the inner laser emission units LD2 and LD3 and thermal crosstalk of the outer laser emission units LD1 and LD4, which were obtained for the structures shown in FIGS. 10A1 to 10A3. In these tables, A, B and C in the structure column denote the structures shown in FIGS. 10A1 to 10A3, respectively.

In structure A, the distances between adjacent inter-element insulating films are all same. That is, in structure A, the distances between adjacent isolation grooves are equal to each other. A difference in thermal crosstalk between the inner laser emission units and the outer laser emission units is 3.45 for the structure A, as one example. However, it can be seen that this thermal crosstalk difference decreases with decrease in the distance between the inter-element insulating films formed on both sides of the outermost laser emission unit. The difference in thermal crosstalk between the inner laser emission units and the outer laser emission units is 2.52 for the structure B and is 1.07 for the structure C. As a result, by changing a distance between inter-element insulating films, that is, positions of the inter-element insulating films, it is possible to reduce differences of thermal crosstalk characteristics.

Figure 11:
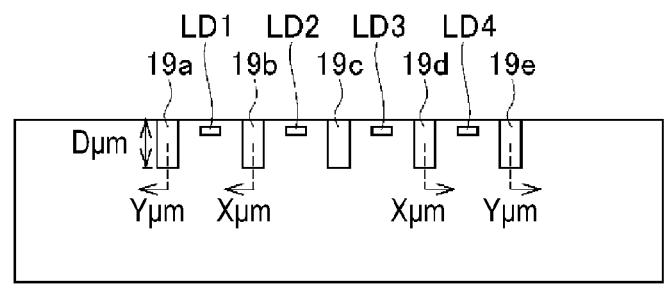
FIG. 11 illustrates a positional relationship between isolation grooves and laser emission units.

Results of detailed review will be described below. FIG. 11 shows a more simplified structure of the multi-beam semiconductor laser apparatus shown in FIGS. 10A1 to 10A3. As shown, a stacked structure of this multi-beam semiconductor laser apparatus includes isolation grooves 19a to 19e and active layers of laser emission units LD1 to LD4, which are separated from each other by the isolation grooves 19a to 19e.

In FIG. 11, D denotes a depth [μm] of each isolation groove. A width of each isolation groove is set to 3 μm. At first, to separate the laser emission units from each other, distances between two isolation grooves formed on both sides of the respective laser emission units are set to be equal to each other, and amounts of shift when the isolation grooves are shifted to the outer side after that time are assumed as X μm and Y μm. That is, distances between the isolation groove 19a and the isolation groove 19b, between the isolation groove 19b and the isolation groove 19c and between the isolation groove 19c and the isolation groove 19d are set to be equal to each other.

Figure 12:
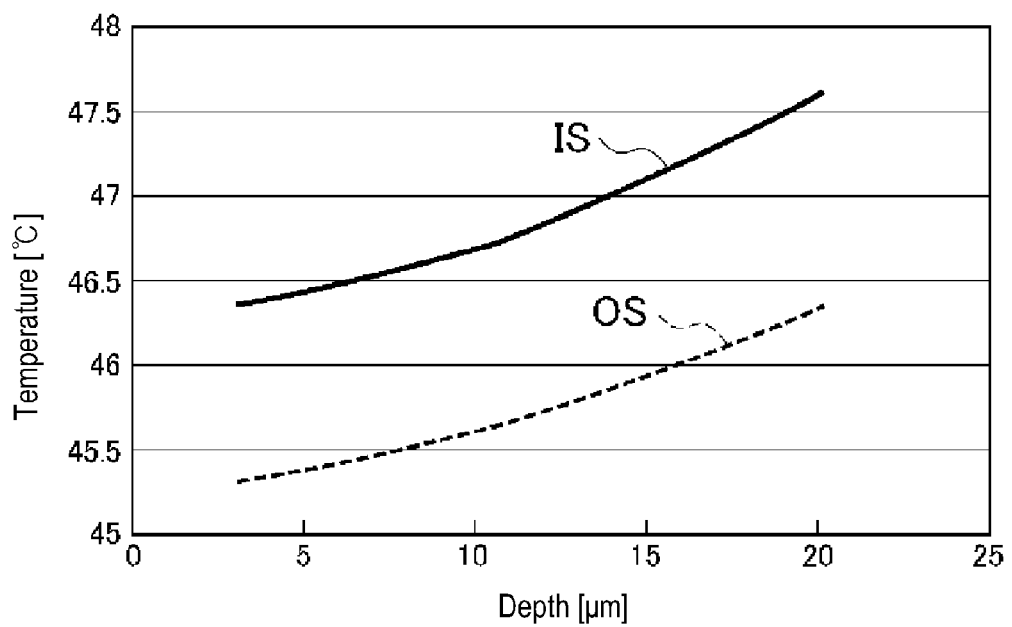
FIG. 12 illustrates a relationship between a depth of isolation grooves and a temperature of laser emission units, with a width of isolation grooves set to 3 µm, for outer and inner laser emission units.

FIG. 12 is a graph showing results of a calculation for a change in temperature of the inner laser emission units LD2 and LD3 and a change in temperature of the outer laser emission units LD1 and LD4 when X=0 and Y=0 and D is varied in FIG. 11. In the following description, the temperature of the inner laser emission units LD2 and LD3 means an average temperature of LD2 and LD3 and the temperature of the outer laser emission units LD1 and LD4 means an average temperature of LD1 and LD4.

Figure 13:
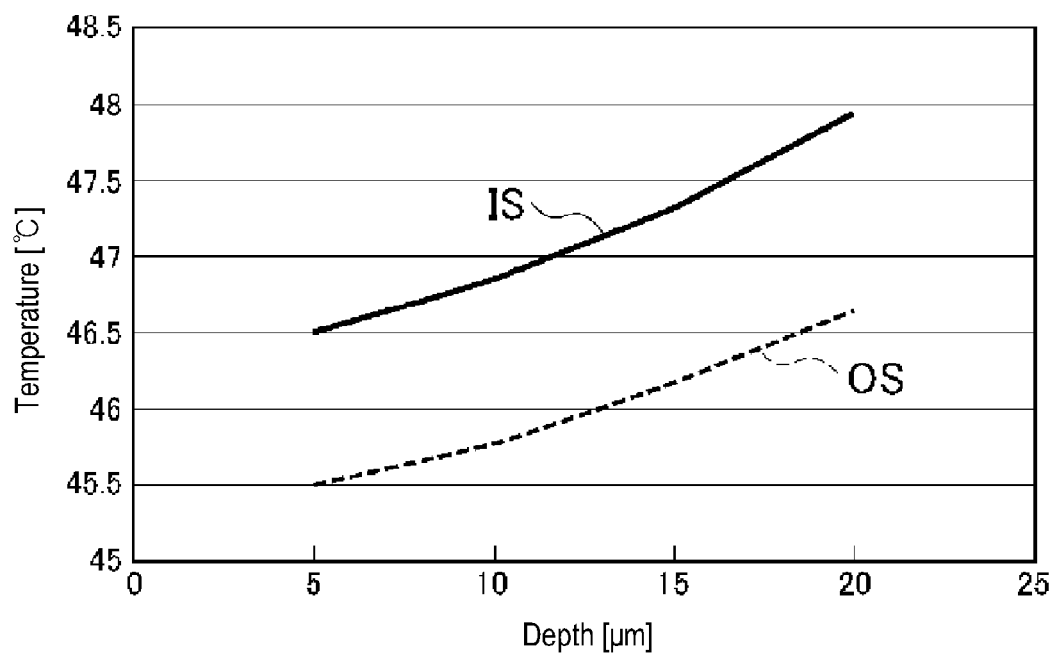
FIG. 13 illustrates a relationship between a depth of isolation grooves and a temperature of laser emission units, with a width of the isolation grooves set to 5 µm, for outer and inner laser emission units.

In this graph, IS denotes a change in temperature of the inner laser emission units LD2 and LD3 and OS denotes a change in temperature of the outer laser emission units LD1 and LD4. As can be seen from comparison between IS and OS, even when a depth of each isolation groove is increased without changing its position, the temperature of the inner laser emission units is always higher than the temperature of the outer laser emission units. Under such conditions, a thermal crosstalk difference may be difficult to reduce FIG. 13 is a graph showing a change in temperature of the inner and outer laser emission units when a depth of each isolation groove is increased without changing its position, like FIG. 12, but with a width of each isolation groove changed from 3 μm to 5 μm.

However, it can be also seen that, even when the width of each isolation groove is increased to 5 μm and the depth of each is also increased from 5 μm to 20 μm, the temperature of the inner laser emission units is higher than the temperature of the outer laser emission units. In this case, thermal crosstalk difference may be difficult to reduce.

Figure 14A:
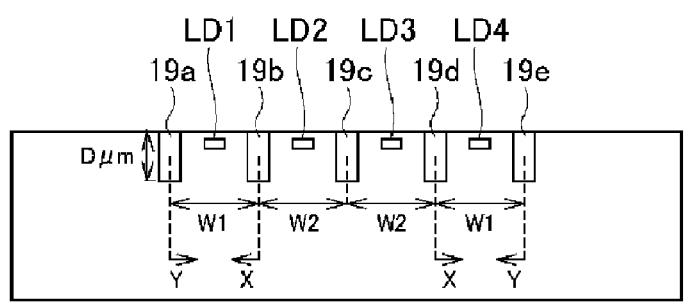
FIGS. 14A and 14B illustrate a relationship between a depth of isolation grooves and a temperature of laser emission units, with positions of isolation grooves varied, for outer and inner laser emission units.
Figure 14B:
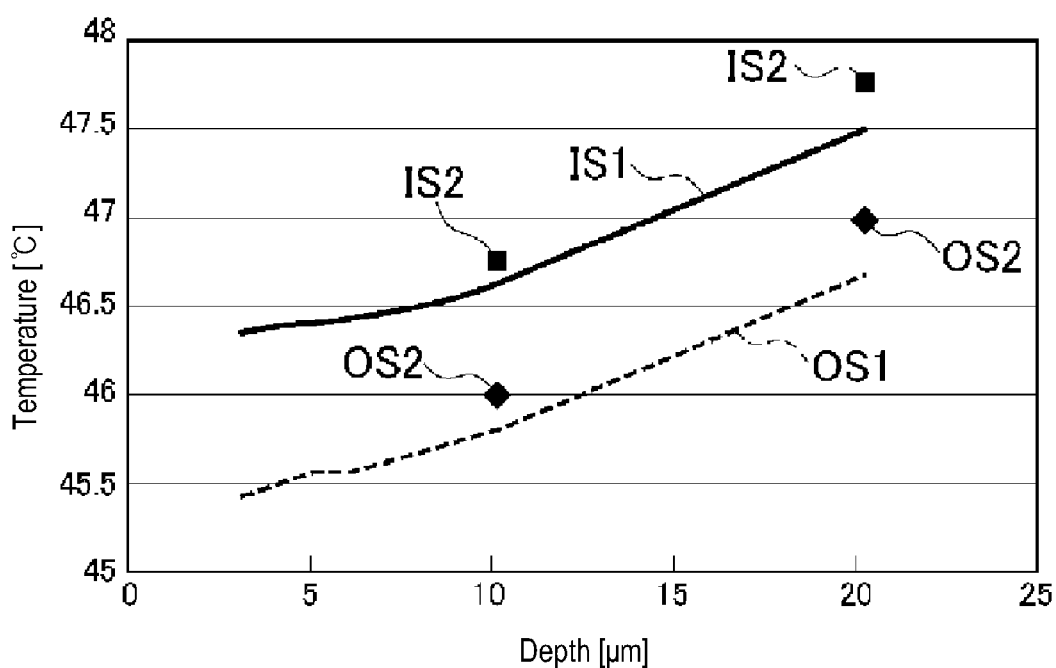

Next, as shown in FIG. 14A, for the inner and outer laser emission units, the positions X and Y of the isolation grooves are varied to change a distance between two isolation grooves formed with a laser emission unit interposed therebetween. A distance between two isolation grooves for the inner laser emission units was assumed as W2 and distances between two isolation grooves for the outer laser emission units, that is, a distance between the isolation grooves 19a and 19b and a distance between the isolation grooves 19d and 19e, were assumed as W1. The isolation grooves were shifted from their initial positions to X=1.5 lam and Y=−1.5 μm, respectively. Accordingly, W1 becomes shorter by 3 μm than its initial length and W2 becomes longer by 1.5 lam than its initial length. FIG. 14B is a graph showing a temperature characteristic when a depth of each isolation groove is increased. In this graph, IS1 denotes a temperature characteristic of the inner laser emission units and OS1 denotes a temperature characteristic of the outer laser emission units. For each of IS1 and OS1, an isolation groove width is set to 3 μm. On the other hand, IS2 indicated by a black square denotes a temperature characteristic of the inner laser emission units when the isolation groove width is set to 5 μm and OS2 indicated by a black diamond denotes a temperature characteristic of the outer laser emission units when the isolation groove width is set to 5 μm.

As can be understood now, with the total amount of left and right shift of 3 lam or so of the isolation grooves, even when the depth of the isolation grooves are varied, the temperature of the inner laser emission units is always increased. In this case, it may be difficult to reduce the thermal crosstalk difference.

Figure 15A:
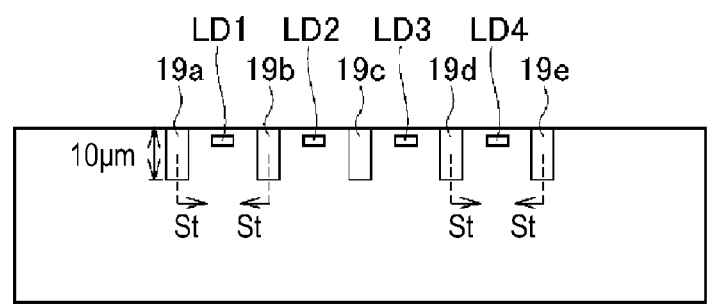
FIGS. 15A and 15B illustrate a relationship between shift amount of isolation grooves and a temperature of laser emission units for outer and inner laser emission units.
Figure 15B:
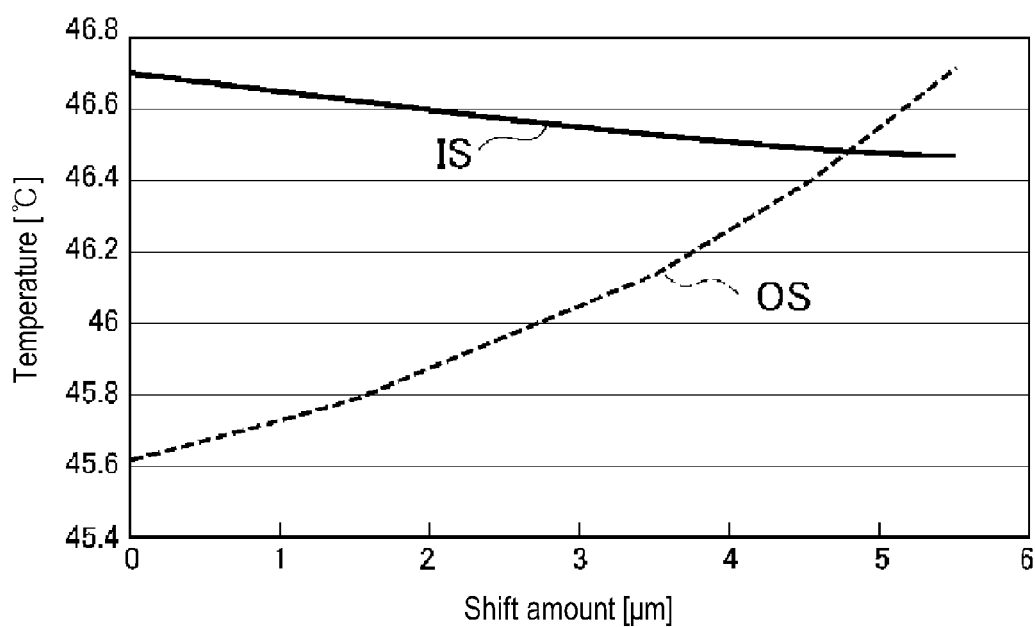

FIG. 15B show a temperature characteristic when the amount of shift of the isolation grooves for the outer laser emission units is further increased. As shown in FIG. 15A, the two isolation grooves 19a and 19b formed on both sides of the outer laser emission unit LD1 are shifted by the same shift amount (St) to be closer to LD1. At the same time, the two isolation grooves 19d and 19e formed on both sides of the outer laser emission unit LD4 are shifted by the same shift amount (St) to be closer to LD4. At this time, the width between the two isolation grooves 19b and 19c formed on both sides of the inner laser emission unit LD2 and the width between the two isolation grooves 19c and 19d formed on both sides of the inner laser emission unit LD3 are increased by the same shift amount (St).

FIG. 15B is a graph showing a relationship between the shift amount (St) [μm] and temperature [° C.] of laser emission units, according to some embodiments. In this graph, IS1 denotes a temperature characteristic of the inner laser emission units and OS1 denotes a temperature characteristic of the outer laser emission units. Here, the width and depth of the isolation grooves were set to 3 μm and 10 μm, respectively, for purposes of illustration. As the shift amount (St) is increased and the distance between two isolation grooves formed with an outer laser emission units interposed therebetween is decreased, the temperature of the outer laser emission units increases and the temperature of the inner laser emission units decreases.

It can be also seen that IS intersects OS between 4.5 μm and 5 μm of the shift amount (St) and there appears a shift amount at which a difference in temperature between the inner laser emission units and the outer laser emission units disappears. In this manner, as the width between two isolation grooves formed on both sides of the outer laser emission units other than the inner laser emission units gets smaller, a thermal crosstalk difference can be reduced.

Here, since the distance between adjacent ridges was set to 28 μm as described above, the distance between two adjacent isolation grooves of the outer laser emission units is also 28 μm. Since the shift amount (St) at the intersection of IS and OS is about 4.75 μm, the distance between the two adjacent isolation grooves is changed to 18.5 μm (28 μm-9.5 μm). In addition, the distance between two adjacent isolation grooves of the inner laser emission units is changed to 32.75 μm (28 μm+4.75 μm). A ratio of the former distance to the latter distance is 56 [%] (=18.5/32.75).

Figure 16A:
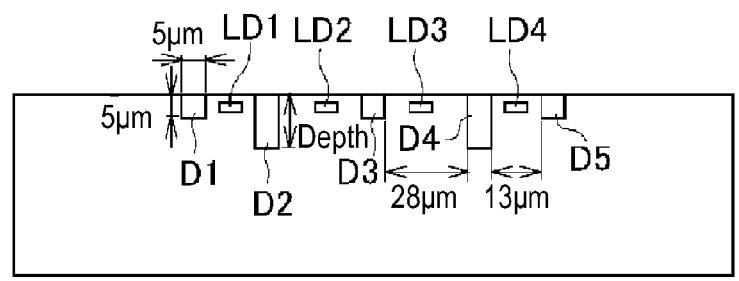
FIGS. 16A and 16B illustrate a relationship between a depth of isolation grooves of inner laser emission units and a temperature of laser emission units for outer and inner laser emission units.
Figure 16B:
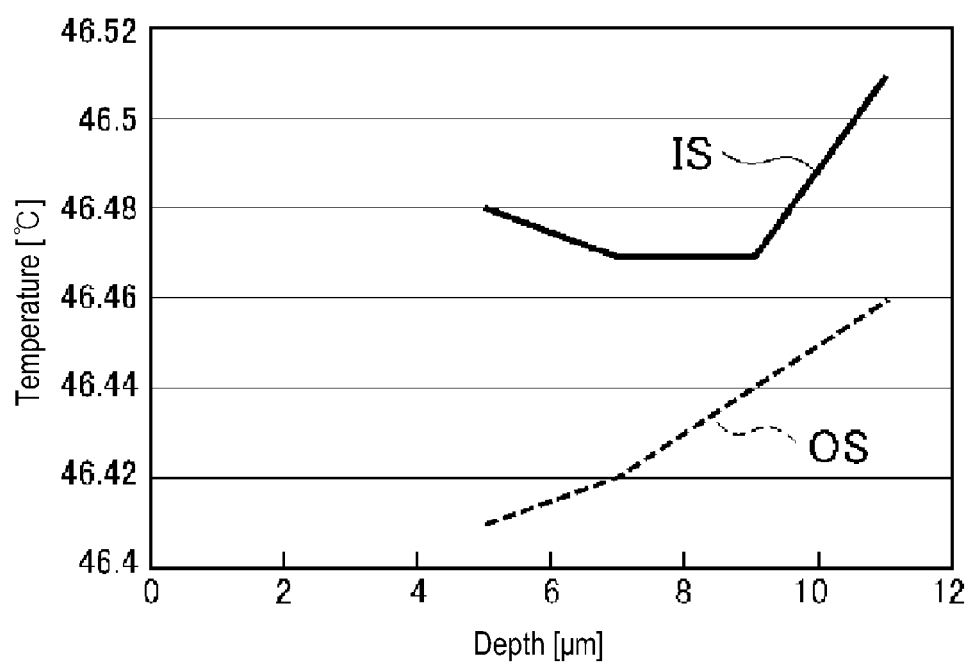

FIG. 16B shows a temperature characteristic of laser emission units when the depth of isolation grooves is varied at their different positions. As shown in FIG. 16A, isolation grooves separating laser emission units LD1, LD2, LD3 and LD4 from each other are assumed as D1, D2, D3, D4 and D5 in order. Widths of the isolation grooves D1, D2, D3, D4 and D5 were all set to 5 μm. The shift amount (St) of the isolation grooves D4 and D5 formed on both sides of the laser emission unit LD4 was set to 5 μm. Other isolation grooves had no shift. Accordingly, the inner width between D1 and D2 is 23 μm and the inner width between D2 and D3 is also 23 μm. However, the inner width between D3 and D4 is 28 μm and the inner width between D4 and D5 is 13 μm. In addition, a temperature characteristic was examined by varying the depth of the isolation grooves D2 and D4 for the inner laser emission units with the depth of the isolation grooves D1, D3 and D5 set to 5 µm.

In a graph shown in FIG. 16B, IS denotes a temperature characteristic of the inner laser emission units LD2 and LD3 and OS denotes a temperature characteristic of the outer laser emission units LD1 and LD4. Although the starting point in the graph starts from the same depth (5 µm) of D1, D3 and D5 and the depth of D2 and D4 separating the inner laser emission units from each other is larger than the depth of D1, D3 and D5 separating the outer laser emission units from each other, the temperature of the inner laser emission units is higher than the temperature of the outer laser emission units. It may be difficult to reduce a thermal crosstalk difference under this condition.

Figure 17A:
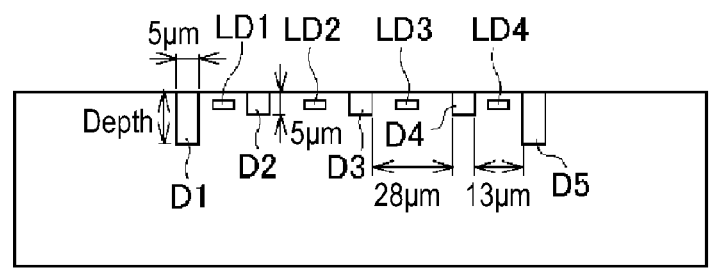
FIGS. 17A and 17B illustrate a relationship between a depth of isolation grooves of outer laser emission units and a temperature of laser emission units for outer and inner laser emission units.
Figure 17B:
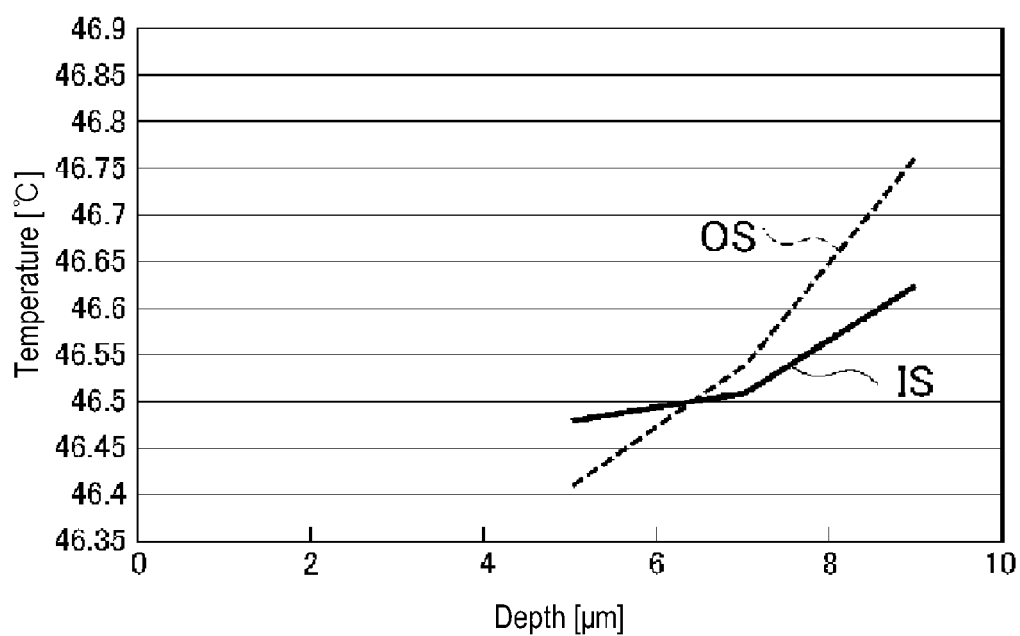

FIG. 17B shows a temperature characteristic when the depth of isolation grooves separating outer laser emission units from each other is varied. As shown in FIG. 17A, the widths of D1 to D5 were all set to 5 µm, for illustration purposes. The depth of the isolation grooves D2, D3 and D4 of the inner laser emission units was set to 5 µm. In addition, like FIG. 16A, the shift amount (St) of the isolation grooves D4 and D5 formed on both sides of the laser emission unit LD4 was set to 5 µm. Other isolation grooves had no shift. Accordingly, the inner width between D1 and D2 is 23 µm and the inner width between D2 and D3 is also 23 µm. However, the inner width between D3 and D4 is 28 µm and the inner width between D4 and D5 is 13 µm.

In addition, a temperature characteristic was examined while increasing the depth of D1 and D5 in order from the same depth (5 µm) as D2, D3 and D4. In a graph shown in FIG. 17B, IS denotes a temperature characteristic of the inner laser emission units LD2 and LD3 and OS denotes a temperature characteristic of the outer laser emission units LD1 and LD4.

When the depth of the outer isolation grooves D1 and D5 separating the outer laser emission units from each other is larger than the depth of the inner isolation grooves D2, D3 and D4 separating the inner laser emission units from each other, a temperature rise ratio of the outer laser emission units becomes larger than that of the inner laser emission units and there appears an intersection of OS and IS. The intersection of OS and IS happens at a depth of about 6.5 µm. In this manner, when the depth of the two outermost isolation grooves separating the outer laser emission units from each other is larger than the depth of the inner isolation grooves formed on both sides of the inner laser emission units, a thermal crosstalk difference can be reduced.

Figure 18A:
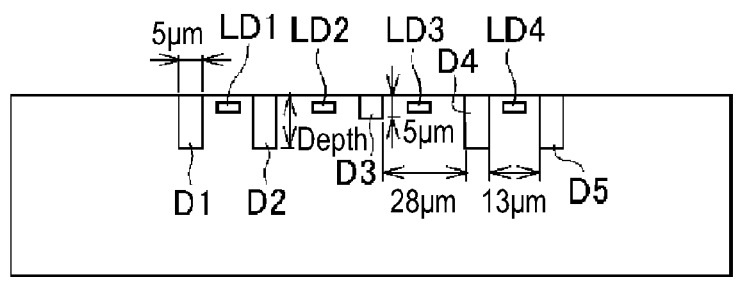
FIGS. 18A and 18B illustrate a relationship between a depth of isolation grooves and a temperature of laser emission units, with depths of isolation grooves equally varied except the central isolation groove, for outer and inner laser emission units.
Figure 18B:
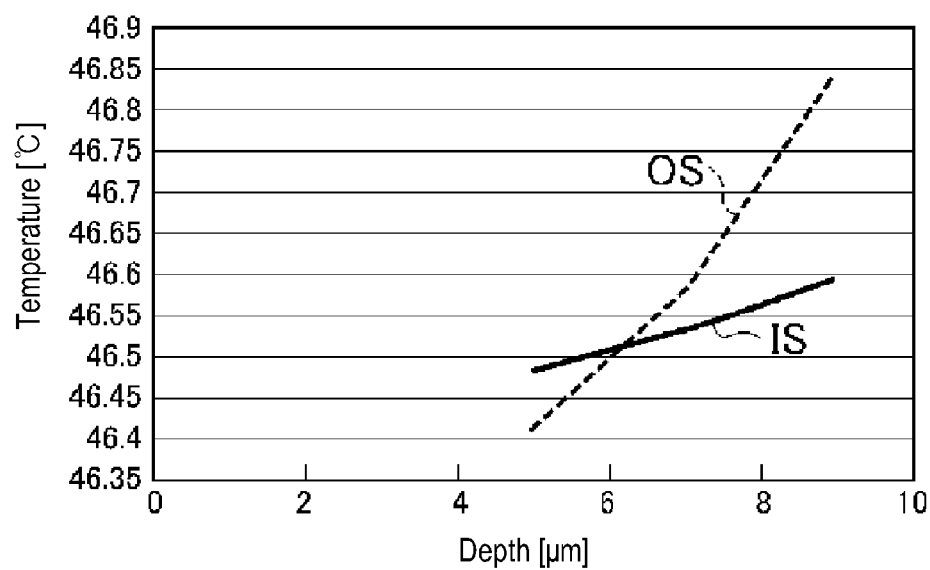

Next, as shown in FIG. 18A, the isolation grooves are modified to vary their depth with their arrangement identical with those of FIGS. 16A and 17A. The widths of the isolation grooves D1 to D5 were all set to 5 µm. The depth of the central isolation groove D3 was set to 5 µm. Then, a temperature characteristic was examined while increasing the depth of the isolation grooves D1, D2, D4 and D5 in order from the same depth (5 µm) as D3. In a graph shown in FIG. 18B, IS denotes a temperature characteristic of the inner laser emission units LD2 and LD3 and OS denotes a temperature characteristic of the outer laser emission units LD1 and LD4. When the depth of the central D3 is fixed and depths of other four isolation grooves are equally increased, a temperature rise ratio of the outer laser emission units becomes larger than that of the inner laser emission units, there appears an intersection of OS and IS at a depth of about 6 µm, and after the intersection, the temperature of the outer laser emission units becomes higher than the temperature of the inner laser emission units, as shown by curves of OS and IS.

In this manner, when the depth of the isolation grooves formed on both sides of the outer laser emission units is larger than the depth of other isolation grooves formed on both sides of the inner laser emission units, a thermal crosstalk difference can be reduced.

Figure 19:
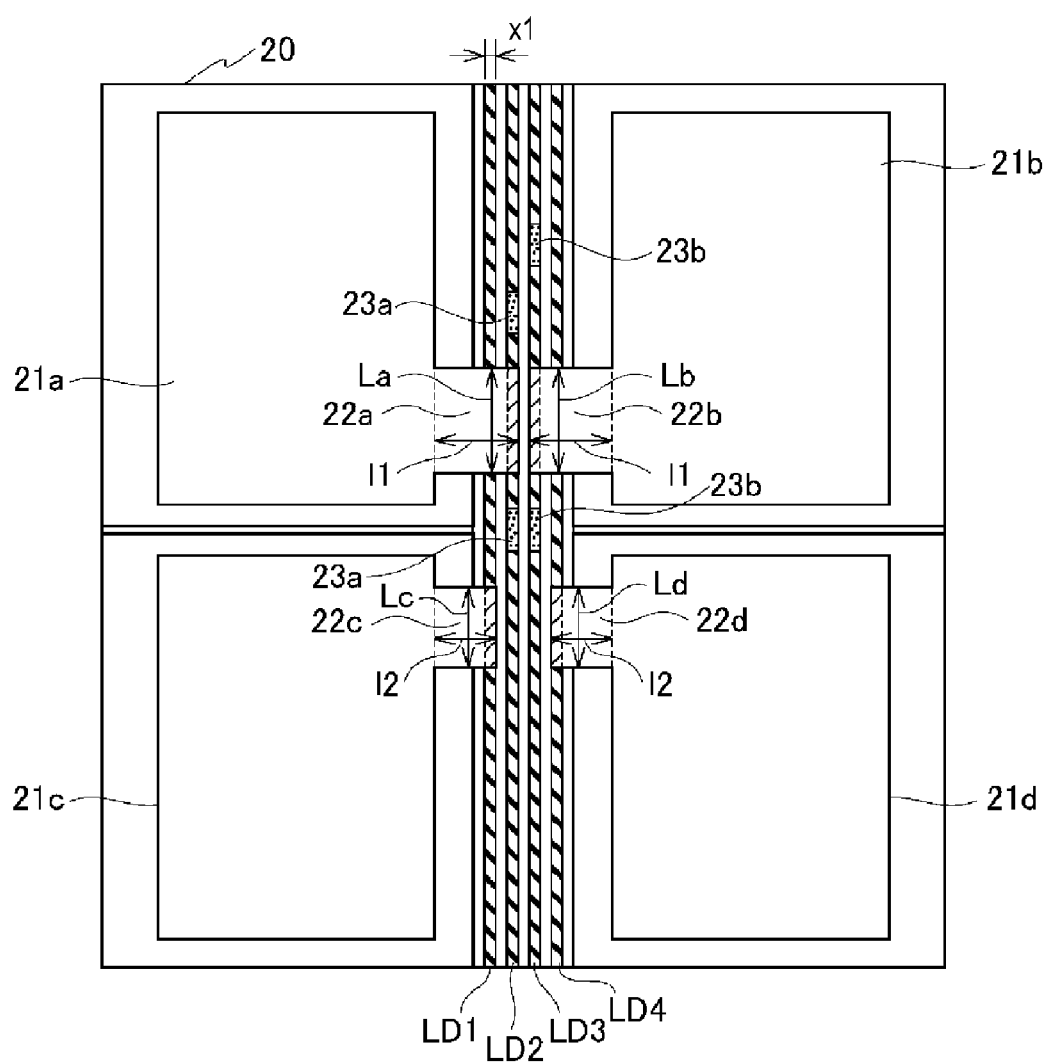
FIG. 19 is a plan view illustrating a configuration where gold plating layers are formed in regions other than wiring layers on ridges of inner laser emission units.

FIG. 19 shows a configuration where an area of a gold plating layer of wiring layers of inner laser emission units LD2 and LD3 is increased to reduce a thermal crosstalk difference, according to some embodiments. The wiring layers 22a to 22d have a multi-layered structure including a metal layer 16 and a plating layer 17 stacked thereon, as shown in FIGS. 2 to 4. In FIG. 19, only the plating layer 17 is extended in the ridge stripe direction with respect to the wiring layers 22a and 22b. Regions 23a and 23b (regions indicated by dots) are the extended regions and are formed with high heat radiant gold plating.

The gold plating layers 23a and 23b are formed on an insulating film 15 stacked on the ridge. The gold plating layer 23a for LD2 is obtained by plating gold on the metal layer and is formed on the uppermost p-type GaAs cap layer 10 of the ridge by removing the insulating film 15. In addition, since the gold plating layer 23b for LD3 is obtained by plating gold on the metal layer, it is formed on a p-electrode 14 by removing the insulating film 15. The p-electrode 14 functions as a ridge electrode and is disposed on an upper part of the ridge.

The gold plating layer 23a makes no contact with the wiring layer 22a and is formed on the ridge of LD2 away from the wiring layer 22a. Likewise, the gold plating layer 23b makes no contact with the wiring layer 22b and is formed on the ridge of LD3 away from the wiring layer 22b. In addition, if the gold plating layers 23a, 23b make no contact with the wiring layers 22a, 22b, they may be formed at a certain position on the ridges of the inner laser emission units.

As described above, by forming gold plating layers in regions having no effect on wiring layers on a ridge of inner laser emission units which are likely to store heat, it is possible to improve heat radiation and reduce a thermal crosstalk difference between each laser emission units.

The multi-beam semiconductor laser apparatus of the present disclosure has a wide range of applications, including an optical disk apparatus, a laser beam printer, a copy machine and so on.

With the above configuration, the heat radiation of the inner semiconductor laser light emission units becomes high and the heat radiation of the outer semiconductor laser light emission units becomes low. Accordingly, a thermal crosstalk characteristic individual difference can be reduced.

In addition, although the inner semiconductor laser light emission units have higher resistance based on a wiring layer length than the outer semiconductor laser light emission units, the inner semiconductor laser light emission units have lower contact resistance with the ridge electrodes than the outer semiconductor laser light emission units. Accordingly, since the resistance of the inner semiconductor laser light emission units can approach the resistance of the outer semiconductor laser light emission units as a whole, laser emission characteristics can be substantially uniform.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions, combinations, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A multi-beam semiconductor laser apparatus comprising:
   at least four stripe semiconductor laser emission units disposed in parallel on a substrate;
   a plurality of isolation grooves configured to separate the semiconductor laser emission units from each other; and
   a plurality of pad electrodes disposed on outer sides of outermost semiconductor laser emission units;
   wherein the isolation grooves are formed between the pad electrodes and the semiconductor laser emission units adjacent to the pad electrodes and between adjacent semiconductor laser emission units;
   wherein a distance between two isolation grooves formed on both sides of the outermost semiconductor laser emission units is smaller than a distance between two isolation grooves formed on both sides of inner semiconductor laser emission units; and
   wherein a difference between the distance between the two isolation grooves formed on both sides of the inner semiconductor laser emission units and the distance between the two isolation grooves formed on both sides of the outermost semiconductor laser emission units is between 13.15 μm and 15.00 μm.

2. The multi-beam semiconductor laser apparatus according to claim 1, wherein a depth of outermost isolation grooves is larger than a depth of inner isolation grooves.

3. The multi-beam semiconductor laser apparatus according to claim 1, further comprising:
   a plurality of stripe ridges configured to be placed in the semiconductor laser emission units;
   a plurality of ridge electrodes formed on the stripe ridges; and
   a plurality of wiring layers formed in a direction traversed from a direction of the stripe ridges for electrical connection with the ridge electrodes;
   wherein inner semiconductor laser emission units include gold plating layers formed on the ridge electrodes at positions that are electrically isolated from the wiring layers.

4. The multi-beam semiconductor laser apparatus according to claim 3,
   wherein the pad electrodes are connected to the plurality of wiring layers; and
   wherein inner semiconductor laser emission units have a larger contact area between the wiring layers and the ridge electrodes than the outermost semiconductor laser emission units.

5. The multi-beam semiconductor laser apparatus according to claim 4, wherein the contact area between the wiring layers and the ridge electrodes gradually increase as it becomes closer to the center of the semiconductor laser emission units.

6. The multi-beam semiconductor laser apparatus according to claim 4, wherein widths of the wiring layers are varied to change the contact area between the wiring layers and the ridge electrodes.

7. The multi-beam semiconductor laser apparatus according to claim 4, wherein the contact area between the wiring layers and the ridge electrodes has an elliptical shape.

* * * * *